United States Patent
Dovek et al.

(10) Patent No.: US 6,181,532 B1
(45) Date of Patent: Jan. 30, 2001

(54) STABILIZED MR SENSOR AND FLUX/HEAT GUIDE JOINED BY CONTIGUOUS JUNCTION

(75) Inventors: Moris Musa Dovek, San Carlos; Robert E. Fontana, San Jose; Richard Hsiao, San Jose; Mohamad Towfik Krounbi, San Jose; Hugo Alberto Emilio Santini, San Jose; Virgil Simon Speriosu, San Jose, all of CA (US)

(73) Assignee: International Business Machines Corporation, Armonk, NY (US)

( * ) Notice: Under 35 U.S.C. 154(b), the term of this patent shall be extended for 0 days.

(21) Appl. No.: 09/280,489

(22) Filed: Mar. 30, 1999

Related U.S. Application Data

(62) Division of application No. 08/672,516, filed on Jun. 17, 1996, now Pat. No. 5,930,084.

(51) Int. Cl.[7] .................................................. G11B 5/39
(52) U.S. Cl. ........................................ 360/321; 360/327.3
(58) Field of Search .................................... 360/113, 126; 324/252; 338/32 R

(56) References Cited

U.S. PATENT DOCUMENTS

| | | | |
|---|---|---|---|
| 4,841,398 | 6/1989 | Mowry | 360/113 |
| 4,891,725 | 1/1990 | Mowry | 360/113 |
| 5,018,037 | 5/1991 | Kroubi et al. | 360/113 |
| 5,206,774 | 4/1993 | Blakeslee et al. | 360/113 |
| 5,241,439 | 8/1993 | Michalek et al. | 360/113 |
| 5,258,883 | 11/1993 | Ruigrok | 360/113 |
| 5,262,914 | 11/1993 | Chen et al. | 360/113 |
| 5,270,895 | 12/1993 | Ruigrok et al. | 360/113 X |
| 5,291,363 | 3/1994 | Somers | 360/113 |
| 5,311,385 | 5/1994 | Schwarz et al. | 360/113 |
| 5,351,158 | 9/1994 | Shibata | 360/113 |
| 5,375,022 | 12/1994 | Gill et al. | 360/113 |
| 5,469,317 | 11/1995 | Nagata et al. | 360/113 |
| 5,644,455 | 7/1997 | Schultz | 360/113 |
| 5,646,804 | 7/1997 | Backer et al. | 360/113 |

FOREIGN PATENT DOCUMENTS

| | | |
|---|---|---|
| 58-185020 | 10/1983 | (JP) . |
| 7-244822 | 9/1995 | (JP) . |
| 8-36717 | 6/1996 | (JP) . |

*Primary Examiner*—William R. Korzuch
(74) *Attorney, Agent, or Firm*—Gray Cary Ware & Freidenrich LLP; Ervin F. Johnston

(57) ABSTRACT

The back end of an MR sensor and a flux guide are joined by a contiguous self-aligned junction so that a predictable overlap of the flux guide on the back end of the MR sensor can be achieved for optimizing signal flux density in the MR sensor. Lead/longitudinal bias layers for the MR sensor are also joined by a contiguous self-aligned junction to the flux guide for stabilizing the flux guide. By employing a single lift off resist mask the MR sensor and the lead/longitudinal bias layers can be patterned followed by deposition of the flux guide. The flux guide is a bilayer of an insulation material layer and a flux guide material layer. The insulation material layer is sandwiched between the MR sensor and the flux guide material layer and between the lead/longitudinal bias layers and the flux guide material layer. A heat guide or combined flux guide and heat guide may be substituted for the aforementioned flux guide.

8 Claims, 13 Drawing Sheets

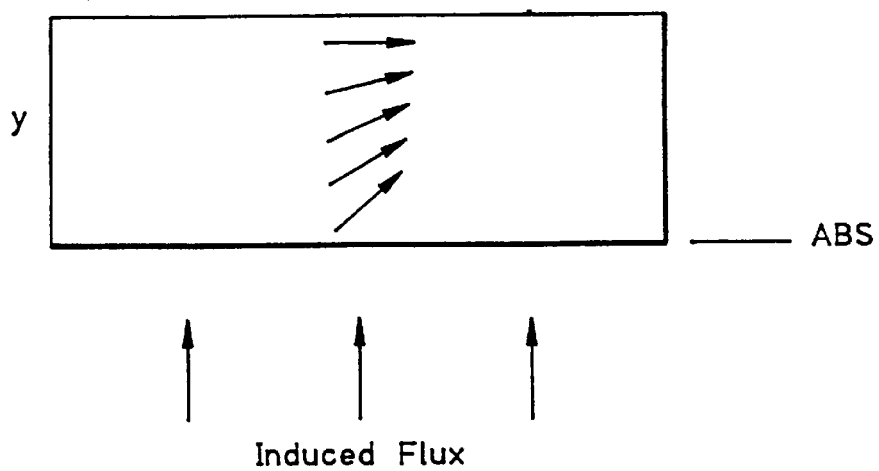
Induced Flux
FIG. 10
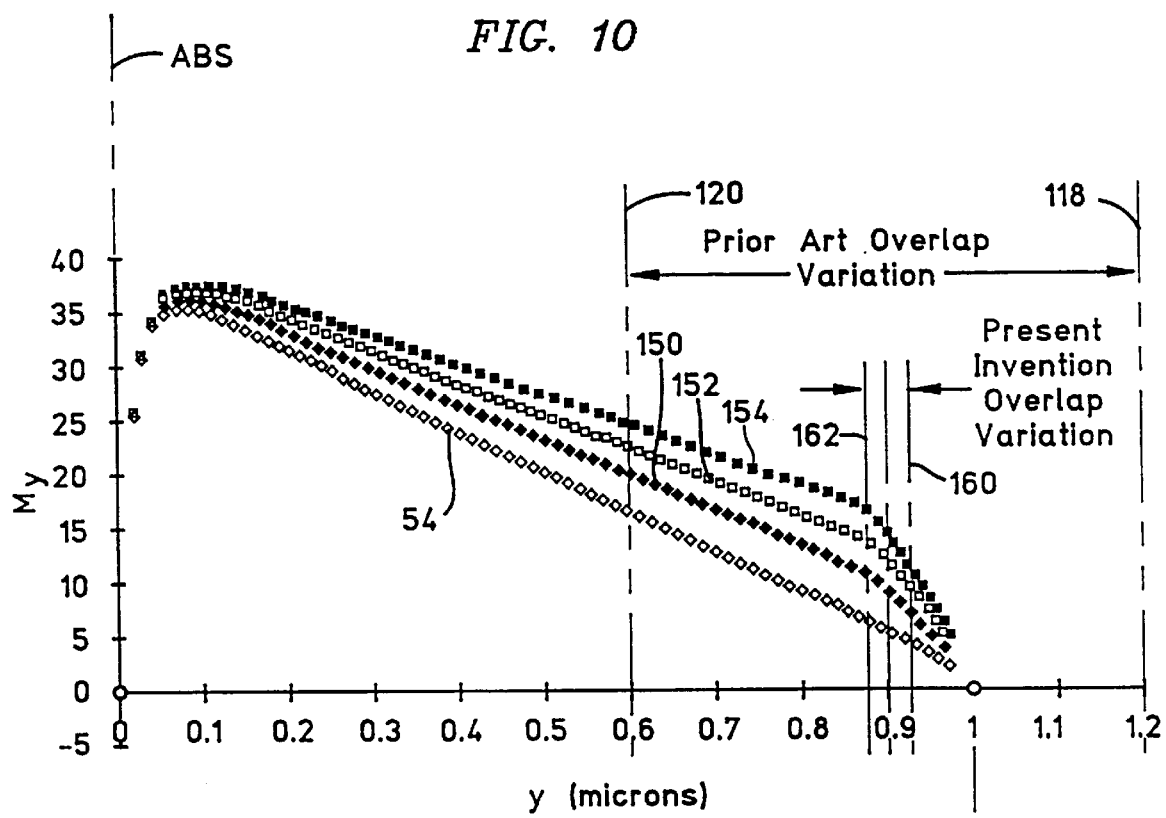
FIG. 11
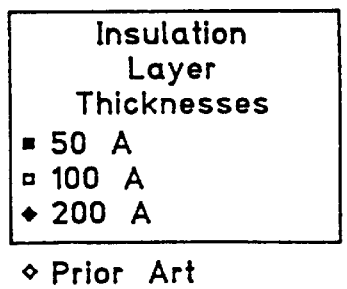

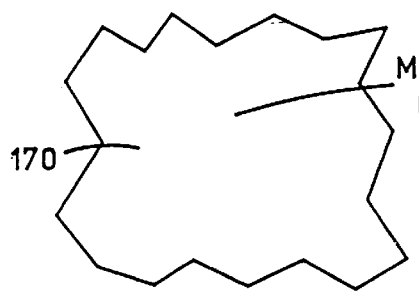
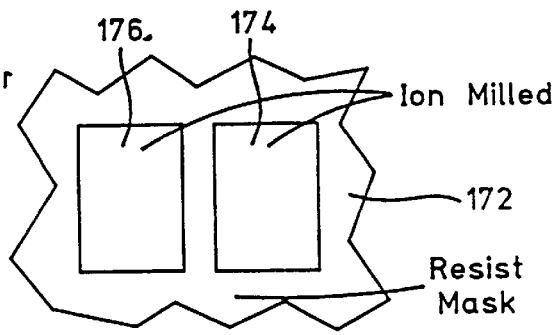
FIG. 12A
FIG. 12B
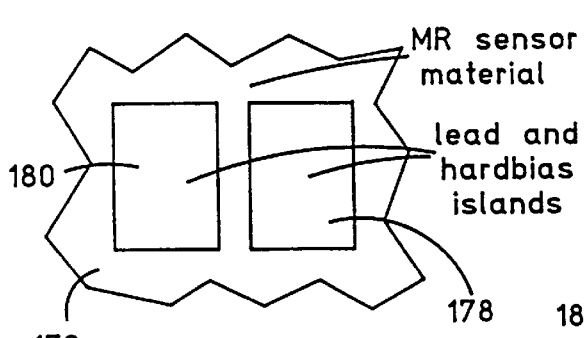
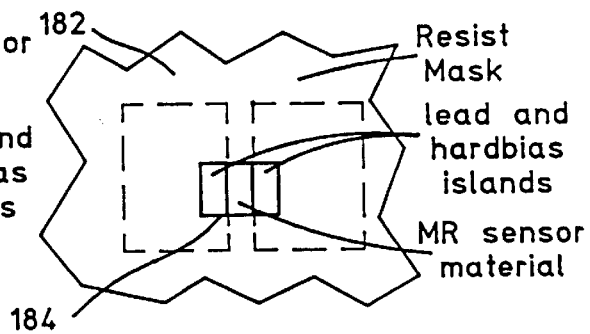
FIG. 12C
FIG. 12D
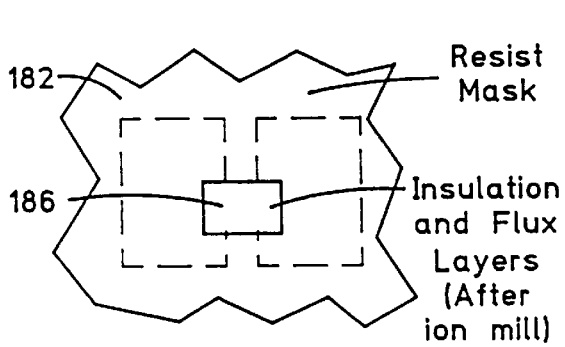
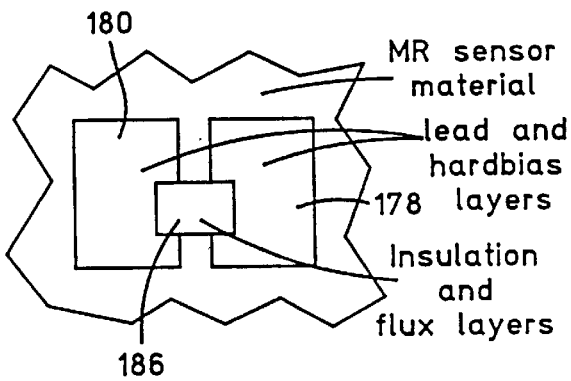
FIG. 12E
FIG. 12F
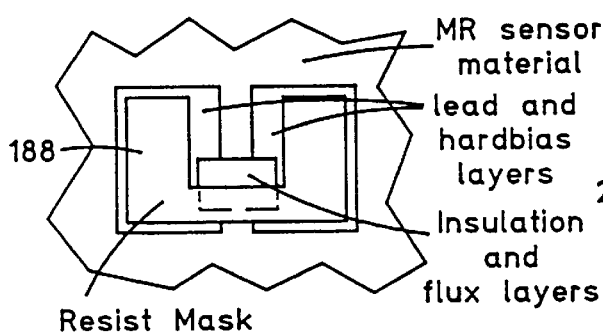
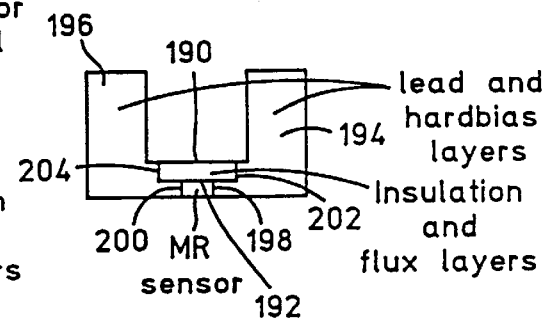
FIG. 12G
FIG. 12H

STABILIZED MR SENSOR AND FLUX/HEAT GUIDE JOINED BY CONTIGUOUS JUNCTION

CROSS REFERENCE TO RELATED APPLICATION

This application is a divisional application of application Ser. No. 08/672,516 filed Jun. 17, 1996 which issued as U.S. Pat. No. 5,930,084.

BACKGROUND OF THE INVENTION

1. Field of the Invention

The present invention relates to an MR sensor and a flux guide which are stabilized by hard bias layers to prevent Barkhausen noise and which are joined by a contiguous self-aligned junction so as to provide a predictable overlap of the flux guide on a back end portion of the MR sensor thereby optimizing signal flux density in the MR sensor.

2. Description of the Related Art

A magnetoresistive (MR) sensor is employed in an MR read head for sensing magnetic fields on a magnetic storage medium, such as a rotating magnetic disk. The MR read head is carried on a slider mounted on a suspension. The suspension, in turn, is mounted to an actuator. The suspension biases the slider toward a surface of the disk. When the disk rotates, the loading is counterbalanced by a cushion of air (an "air bearing") generated by the rotating disk. The actuator moves the head to selected information tracks on the rotating magnetic disk. The resistance of the MR sensor changes in proportion to the change in magnetic field intensity caused by rotation of the disk. When a sense current is conducted through the MR sensor, the current changes in proportion to the change in resistance. Changes in the sense current are processed by a processor to produce playback signals corresponding to the information stored on the magnetic disk.

An MR sensor includes a stripe of MR material sandwiched between a pair of very thin insulative gap layers which are, in turn, sandwiched between a pair of magnetically conductive shield layers. Magnetic flux reaching the MR sensor extends through the gap layers to the shield layers. The MR sensor has an exposed edge at an air bearing surface (ABS) of the slider on which it is carried. The exposed edge interfaces with the air bearing. The MR sensor also has a back edge which is normally parallel to the air bearing surface and is embedded within the MR head. The magnitude of magnetic flux that reaches the MR sensor is at a maximum at the ABS. This magnitude decays along the MR stripe height and into the shields with a characteristic decay length. A boundary condition requires the flux magnitude to be zero at the back edge. When the stripe height of the MR sensor from the ABS to the back edge is less than the decay length, which will be described hereinafter, the flux loss along the height of the MR sensor is linear.

In the invention, which will be described in detail hereinafter, a flux guide is connected at the back edge of the MR sensor and extends away from the ABS so that only a portion of the magnetic flux reaching the MR sensor extends through the gap layers into the shield layers. With this arrangement a greater amount of flux is sensed in the MR sensor, thereby increasing the magnitude of the readback signal. Optimization of this signal is dependent upon the quality of the junction between the back edge of the MR sensor and the flux guide. The flux guide is a bilayer component comprising an insulation material layer and a flux guide material layer. The junction requires that the insulation material layer be located between the MR sensor and the flux guide material layer. Since the flux is reluctant to flow into the flux guide through an abutting junction at the back edge of the MR sensor it is necessary that the flux guide overlap an end portion of the MR sensor adjacent the back edge. It is also necessary that this overlap be precise. The amount of overlap is dependent upon such factors as the stripe height of the MR sensor and the risk of shorting of the sense current due to possible pinholes in the gap layers. The overlap is typically 0.1 $\mu$m for a 1.0 $\mu$m high MR sensor. When there is no overlap there is insufficient flow of flux into the flux guide and when the overlap is too long flux is conducted out of the MR sensor prematurely and the risk of shorting due to pinholes is increased.

The prior method of making junctions between head components does not provide a precise overlap of a flux guide over a front and/or back end portion of the MR sensor. The reason for this is because the prior art employs two resist masking steps. Under the best of conditions the alignment of a critical edge of the resist mask from a benchmark on a wafer is within +/−0.1 $\mu$m. Another problem arises from unpredictable shrinkage of the resist. The location of the critical edge of the resist due to shrinkage varies +/−0.1 $\mu$m. Even when windage is employed to attenuate the shrinkage problem, shrinkage is still variable from wafer to wafer. Accordingly, when prior art methods place the overlap 0.1 $\mu$m over the back edge of the MR sensor, the result can be an overlap of from 0.3 $\mu$m on the MR sensor to 0.2 $\mu$m off the sensor. Using the square root of the sum of the squares, the standard deviation for the overlap is 0.173 $\mu$m. For any wafer containing multiple MR heads with flux guides constructed according to the prior art, the yield will be unacceptably low because of the variability in overlap between the MR sensor and the flux guides. Accordingly, there is a strong felt need for a method of making junctions between MR sensors and flux guides which have a predictable and repeatable overlap. It is anticipated that the MR sensor height in future heads will be as low as 0.5 $\mu$m. Alignment in these heads will be even more critical than that required for the present heads with an MR sensor height of 1.0 $\mu$m.

Another problem with the prior art process which employs two resist masking steps is the high risk of over-milling the insulation layer during the second resist mask step. This can produce shorting between the MR sensor and the flux guide material layer.

A further problem with flux guides is lack of stabilization in order to prevent Barkhausen noise. The MR sensor, which has a layer of magnetic material, is typically stabilized by a pair of hard bias layers adjacent to its side edges, the side edges extending perpendicular to the ABS. The hard bias layers longitudinally bias the MR sensor parallel to the ABS and stabilize the MR sensor from a multi-magnetic domain state to a single magnetic domain state. Accordingly, upon the termination of flux incursions into the MR sensor, the sensor always returns to a stabilized single magnetic domain state. Without longitudinal biasing the domain walls of multi-magnetic domains shift positions within the sensor, causing Barkhausen noise. This decreases the signal to noise ratio. The same stabilization is necessary for the flux guide because the flux guide material layer is also a magnetic material. In the prior art separate hard bias layers were dedicated for stabilizing the flux guide.

SUMMARY OF THE INVENTION

The present invention provides a junction between an MR sensor and a flux guide which has a predictable overlap of the flux guide on a back end portion of the MR sensor. This is accomplished in part by employing the teachings of commonly assigned U.S. Pat. No. 5,018,037 to Krounbi et al. This patent teaches the making of a contiguous self-aligned junction between conductive layers, such as an MR sensor and leads. Only one resist mask is employed which serves a double function, namely defining an end of the MR sensor and depositing the lead material to make electrical contact with the end. Before the Krounbi et al. patent, two resist masks were employed, one mask for defining the MR sensor and the other mask for overlapping the leads on the MR sensor. The prior art had the aforementioned alignment problems which affected the preciseness of the track width of the MR sensor as defined by the distance between the leads. While the technique described in the Krounbi et al. patent has been employed for making precisely placed electrical junctions between electrically conductive layers, it has not been employed for making electrically insulative magnetically conductive junctions between layers.

The present invention employs the teachings of the Krounbi et al. patent for making insulative junctions between various layers such as between an MR sensor and a flux guide. Only one resist mask is employed for defining the back edge of the MR sensor and depositing the insulation material layer and the flux guide material layer. Like the teachings in the Krounbi et al. patent the resist mask has an undercut which is adjacent the layers. When the insulation material layer and the flux guide material layer are sputtered on the wafer in one embodiment of the invention, some of the sputtered material of each layer overlaps the end portion of the MR sensor within the undercut. This provides the precise overlap sought for flux guides, with the insulation layer located between and electrically insulating the electrically conductive MR sensor from the electrically conductive flux guide material layer. The reason that the overlap is so precise is because the inaccuracies resulting from alignment of the single resist mask and shrinkage of the single resist mask settle at one location where the back edge of the sensor is defined and the material of the flux guide is deposited. In the aforementioned one embodiment of the invention precision of the overlap is controlled by the depth of the undercut, whereas in another embodiment of the invention, precision of the overlap is very exact and the undercut is employed only for lift off. In both embodiments the risk of overmilling the insulation layer of the flux guide is obviated.

An unexpected and surprising advantage of the invention is provision of an insulated contiguous self-aligned junction between the sides of the flux guide and hard bias material layers, which stabilizes the flux guide. Again the insulation material layer insulates the conductive flux guide material layer from the conductive hard bias layers. Since lead layers may interfacially engage the hard bias layers, the lead layers are also insulated from the flux guide material layer. Another feature of the invention is that the same hard bias layers employed for stabilizing the MR sensor are also employed for stabilizing the flux guide.

It should be understood that a heat guide may be substituted for the flux guide or the heat guide may be employed in combination with the flux guide. Accordingly, throughout this description the term heat guide or the term flux/heat guide may be substituted for the term flux guide.

An object of the present invention is to provide a junction with a highly predictable overlap between a back end of an MR sensor and a flux guide.

Another object is to provide an insulated contiguous self-aligned junction which separates a pair of electrically conductive layers.

A further object is to provide an insulated contiguous self-aligned junction which joins an electrically conductive layer to a laminate structure that includes insulation and electrically conductive material layers.

Still another object is to provide an insulated contiguous self-aligned junction between a flux guide and a back end portion of an MR sensor and a contiguous self-aligned junction between side edges of the MR sensor and a pair of hard bias layers.

Still a further object is to accomplish the preceding object with the same hard biasing layers.

Yet another object is to provide a wafer containing multiple MR sensors with insulated flux guides, wherein all flux guides overlap end portions of respective MR sensors by an equal amount.

Yet a further object is to provide a method of making a junction between an MR sensor and a flux guide wherein the guide overlaps a back end portion of the MR sensor by a predictable amount.

Still another object is to provide a method of making an insulated contiguous self-aligned junction between a flux guide and a back end portion of an MR sensor and a contiguous self-aligned junction between side edges of the MR sensor and the flux guide with hard bias layers.

Still a further object is to provide a method of making an insulated contiguous self-aligned junction between a conductive layer and a dual-layer structure that includes an insulation layer and a conductive layer.

Still another object is to provide a rear flux guide for an MR sensor which will improve the signal from the MR sensor at the ABS.

Still a further object is to provide an electrically insulative continuous junction which employs an ultra-thin insulation layer in the order of 200 Å.

Other objects of the present invention and attendant advantages thereof will be more readily appreciated upon reading the description taken together with the following drawings.

BRIEF DESCRIPTION OF THE DRAWINGS

FIG. 10 shows the loss of magnetic moment ($M_y$) along the height of an MR sensor without a flux guide when there is flux induced into the MR sensor at the ABS.

FIG. 11 is a chart showing the loss of magnetic moment ($M_y$) for various junctions between a flux guide and an MR sensor along the height (y) of the MR sensor when flux is induced as shown in FIG. 10.

FIGS. 12A–12H show the present process for making an insulated contiguous self-aligned junction between a flux guide and/or heat guide and a back end portion of an MR sensor and insulated contiguous self-aligned junctions between side edges of the flux guide and/or heat guide and hard bias layers.

DETAILED DESCRIPTION OF THE PREFERRED EMBODIMENTS

Figure 1:
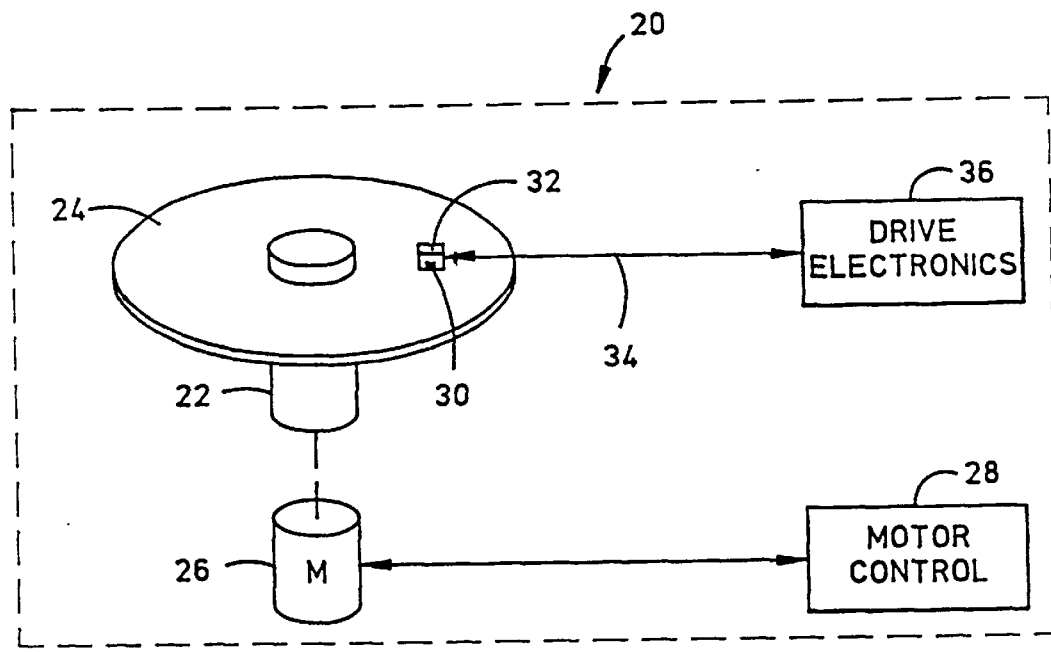
FIG. 1 is a schematic illustration of an exemplary magnetic disk drive which includes the present invention.

Referring now to the drawings wherein like reference numerals designate like or similar parts throughout the several views, there is illustrated in FIG. 1 a disk drive 20. The drive 20 includes a spindle 22 which supports and rotates at least one magnetic disk such as the magnetic disk 24. The spindle 22 is rotated by a motor 26 which is governed by motor control 28. A thin film magnetic head 30 of the present invention is mounted on a slider 32, the slider being supported by a suspension and actuator arm 34. The suspension and actuator arm 34 positions the slider 32 so that the head 30 is in a transducing relationship with a surface of the magnetic disk 24. When the disk 24 is rotated by the motor 26, air is moved by the surface of the disk, causing the slider to ride on an air bearing slightly off of the surface, on the order of 0.075 microns. The head 30 is then employed for writing information to multiple circular tracks on the surface of the disk 24 as well as reading information therefrom. These information signals, as well as servo signals for moving the slider to various tracks, are processed by drive electronics 36.

Figure 2:
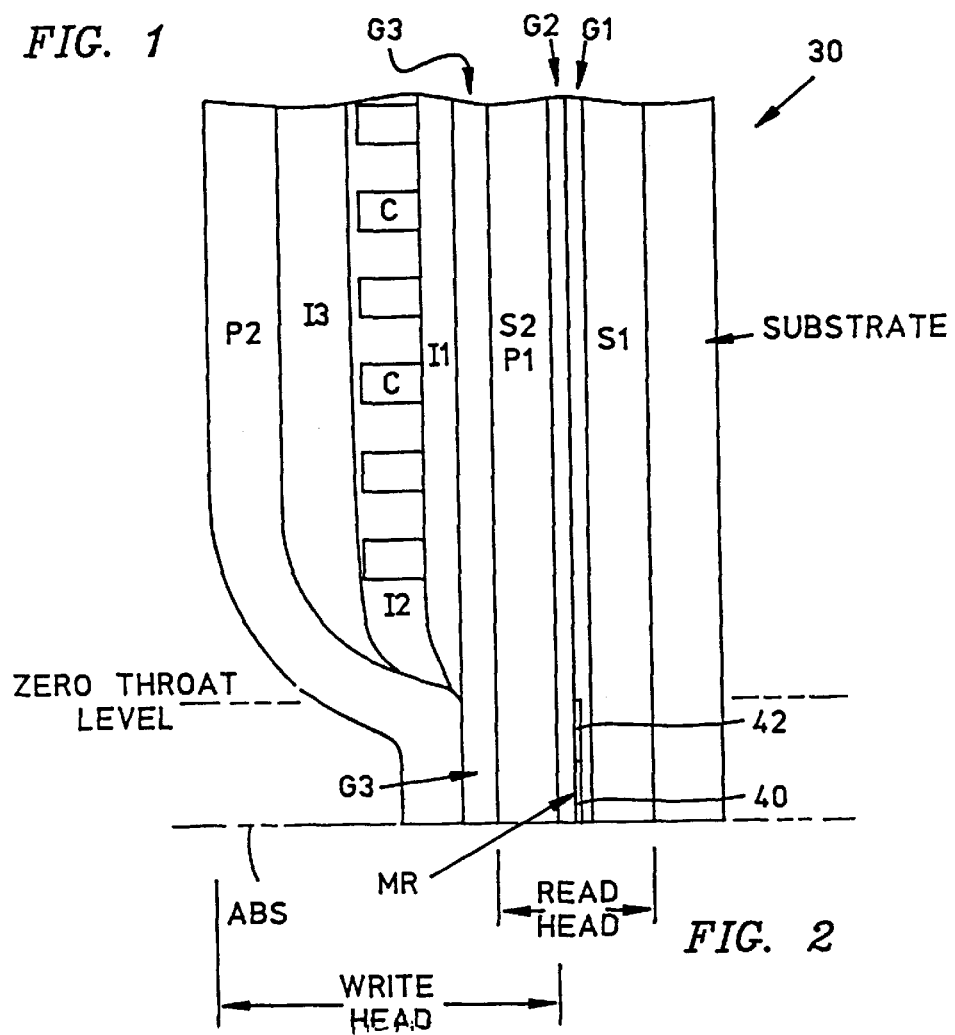
FIG. 2 is a vertical cross section of a merged MR head which includes the present invention.

FIG. 2 is a cross-sectional schematic illustration of the head 30 which includes a read head portion and a write head portion. The head 30 is lapped to form an air bearing surface (ABS), the ABS being spaced from the surface of the rotating disk by the air bearing as discussed hereinabove. The read head portion includes an MR sensor 40 sandwiched between first and second gap layers G1 and G2 which are, in turn, sandwiched between first and second shield layers S1 and S2. The write head portion includes a coil layer C and insulation layer I2 which are sandwiched between insulation layers I1 and I3 which are, in turn, sandwiched between first and second pole pieces P1 and P2. A gap layer G3 is sandwiched between the first and second pole pieces at their pole tips adjacent the ABS for providing a magnetic gap. When signal current is conducted through the coil layer C, flux is induced into the first and second pole layers P1 and P2 causing flux to fringe across the pole tips at the ABS. This flux magnetizes circular tracks on the rotating disk 24, shown in FIG. 1, during a write operation. During a read operation, magnetized regions on the rotating disk inject flux into the MR sensor of the read head, causing resistance changes in the MR sensor. Sensor resistance changes are detected by detecting changes of a sense voltage across the MR sensor. The voltage changes are processed by the drive electronics 36 shown in FIG. 1. The combined head illustrated in FIG. 2 is a "merged" MR head in which the second shield layer S2 of the read head is employed as a first pole piece P1 for the write head. In a piggyback head (not shown) the second shield layer S2 and the first pole piece P1 are separate layers.

Figure 3:
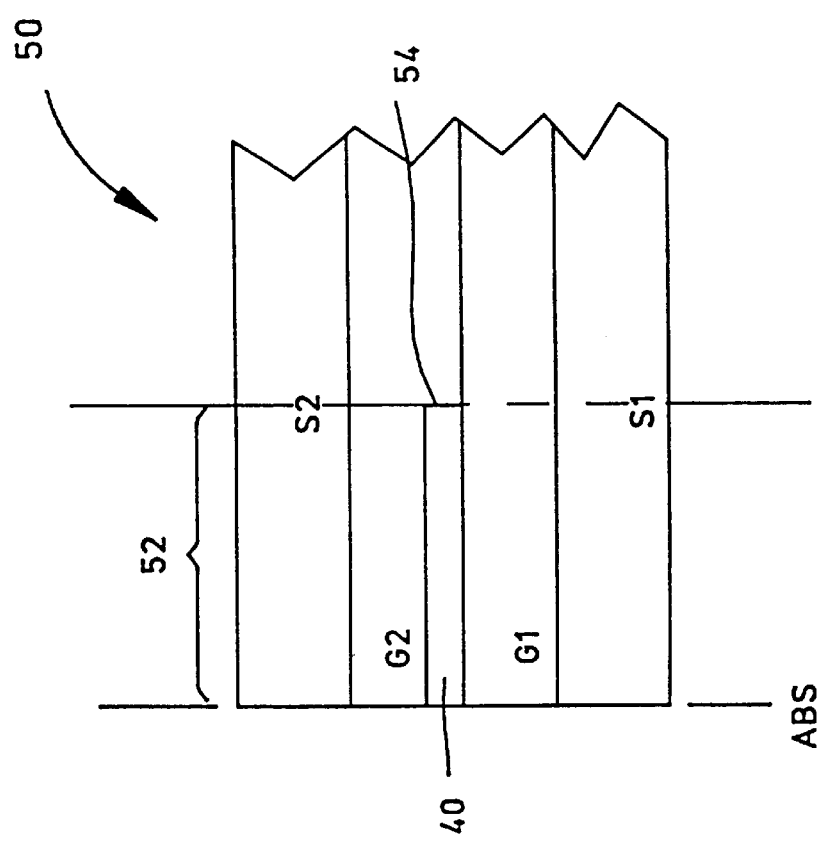
FIG. 3 is a vertical cross section of an MR head showing a prior art MR sensor without a flux guide.

The sense voltage output signal from a shielded MR sensor at the ABS is proportional to the average value of flux contained in the sensor along the stripe (MR) height. When the magnetic head 30 is flying over the surface of the rotating magnetic disk 24, as shown in FIG. 1, the flux is injected at the ABS. The flux is a maximum at the ABS, and then it exponentially decays along the sensor stripe height into the shields S1 and S2 with a decay length k. In FIG. 3 the stripe height is illustrated at 52 for a prior art MR sensor which does not have a back end flux guide. Typical thicknesses are 150 Å for the MR sensor and 1,000 Å for each of the gap layers G1 and G2. The obvious boundary for the flux is at the back end or top height 52 of the MR sensor where the signal flux goes approximately to zero. If the stripe height of the MR sensor is selected at a value less than the decay length of the sensor the average flux will be $\Phi_0/2$ where $\Phi_0$ is the flux at the ABS and $\Phi$ is approximately zero at the stripe height. Pursuant to this parameter, the decay of the flux in a sensor which has a stripe height less than a decay length is substantially linear. This linearity is shown at 54 in FIG. 11 for the prior art MR sensor without a flux guide. The decay length k of an MR sensor is $k=(\mu g t/4)^{0.5}$ where $\mu$ is the permeability of the sensor material, g is the gap between the shields S1 and S2 and t is the thickness of the MR sensor. In order to achieve the maximum signal from the MR sensor, which is established by a linear decay rather than the full exponential decay, most sensor heights are selected to be at a value less than the decay length.

Figure 4:
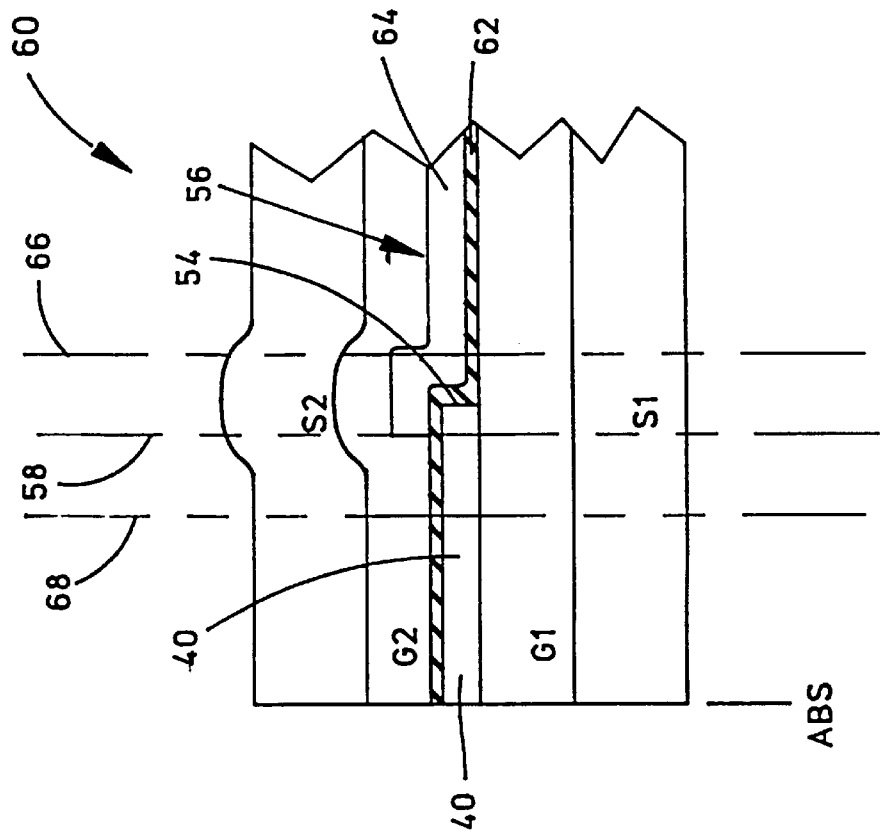
FIG. 4 is a vertical cross section of an MR head showing a junction of an MR sensor with a flux guide constructed by a prior art method.

If the average value of the flux in the MR sensor can be increased there will be a corresponding increase in sense voltage (and readback) signal strength. Accordingly, if the rate of decay of flux, which is attenuated by shield layers S1 and S2, can be decreased, the sense voltage signal strength will be increased. This is a reason for a flux guide 56, as shown in FIG. 4, which is connected at the back end 54 of the MR sensor 40 where it changes the flux boundary condition. The flux guide 56 includes an insulation material layer 62 and a flux guide material layer 64 which abut the back end 54 and overlap a back end portion of the MR sensor 40. When the flux guide 56 is employed the average amount of flux in the MR sensor 40 is increased since the change in the boundary condition causes the rate of decay of flux to decrease. This then increases the sense voltage signal strength. The insulation layer 62 is typically 50 Å thick and the flux guide material layer 64 is typically 150 Å thick. The flux guide 56 and the MR sensor 40 are magnetically coupled in parallel so that flux is dissipated from the flux guide to the first and second shields S1 and S2 at substantially the same rate as flux is dissipated from the MR sensor 40 to the first and second shields.

One of the problems with the flux guide fabrication techniques in FIG. 4 is the difficulty in controlling the amount of overlap of the flux guide 56 on the back end portion of the MR sensor 40, which overlap is shown terminating along line 58. The amount of overlap is extremely important to the efficiency of the MR sensor. If the MR sensor abuts the back end 54 of the MR sensor with no overlap, very little flux will be transferred across the narrow insulation layer into the flux guide material 64. If the flux guide overlaps the back end portion of the MR sensor too much it prematurely transfers the flux into the flux guide, reducing the signal strength in the MR sensor and increasing the potential for shorting between the flux guide and the second shield S2 due to potential pinholes in the second gap layer G2 and the insulation layer 62. An acceptable overlap in the art of recessed sensors has been found to be about 10% of the stripe height. Accordingly, for a stripe height of 1 $\mu$m the overlap of the flux guide over the back end portion of the MR sensor to line 58 should be 0.1 $\mu$m.

This controlled overlap placement of the flux guide 56 on the back end portion of the MR stripe 40 has been difficult to obtain with prior art methods of making flux guides. As will be described hereinafter, the dimensions achievable in the prior art method of making the flux guide shown in FIG. 4 can vary from a gap of 0.2 $\mu$m from the back end 54 to the flux guide as shown at 66, or with an overlap of 0.4 $\mu$m as shown at line 68. As stated hereinabove, if the flux guide terminates at line 66, leaving a gap, there will be no transfer of flux to the flux guide, if the flux guide overlaps to line 68, it will prematurely withdraw flux from the MR sensor, thereby reducing signal strength. With the prior aft method the location of the end of the flux guide can lie anywhere between lines 66 and 68, which means that many heads produced on a wafer will be unacceptable. With the prior art method of making the head 60 in FIG. 4 the head yield is low, which manifests an urgent need for a method which will provide a more controlled overlap placement of the flux guide on the back end portion of the MR sensor.

Figure 6:
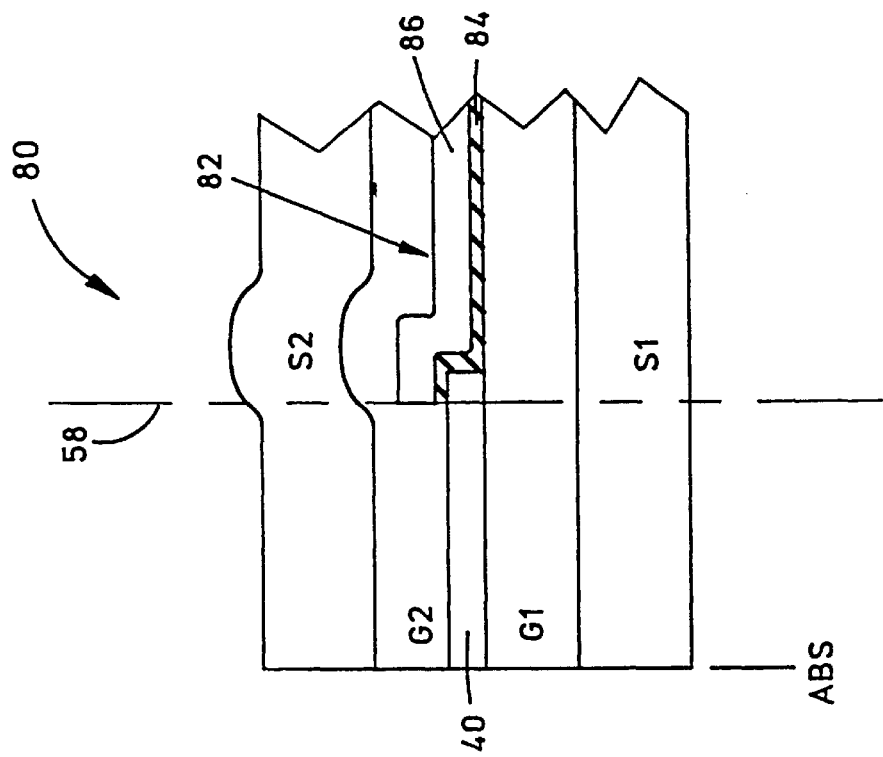
FIG. 6 is a vertical cross section of an MR head showing another embodiment of an insulated contiguous self-aligned junction of an MR sensor with a flux guide.
Figure 5:
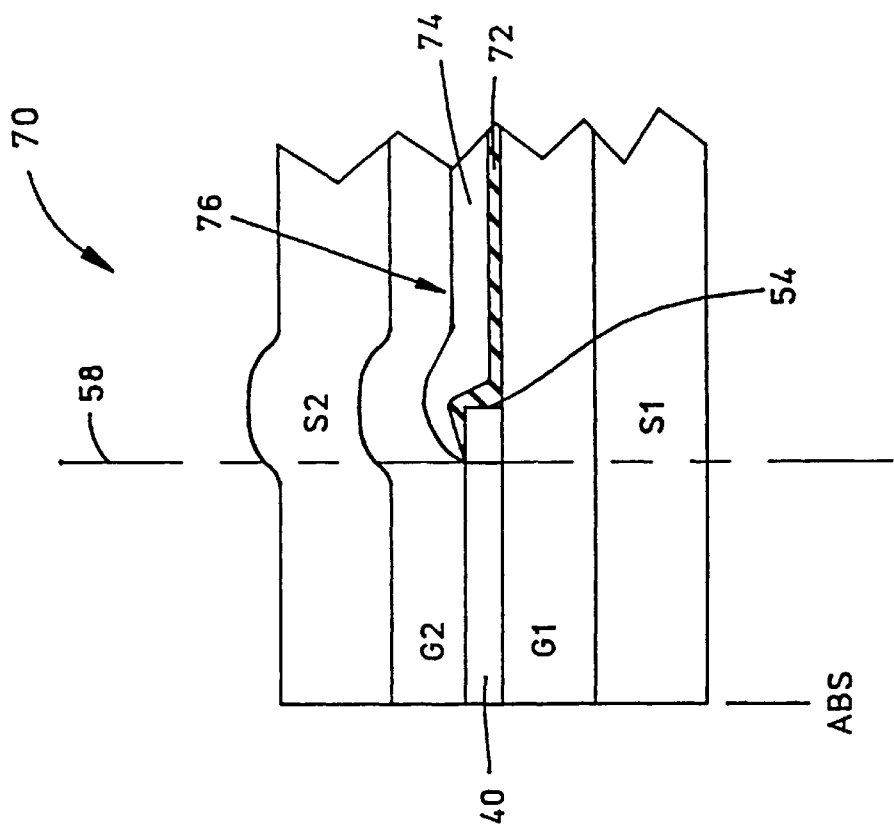
FIG. 5 is a vertical cross section of an MR head showing one embodiment of an insulated contiguous self-aligned junction of an MR sensor with a flux guide.

FIGS. 5 and 6 illustrate embodiments of the present invention wherein the flux guide is constructed by a method which assures controlled placement of the overlap of the flux guide on a back end portion of the sensor. In the embodiment 70, shown in FIG. 5, the insulation material layer 72 and the flux guide material layer 74 slope up the back end 54 of the MR sensor and then slope down on a back end portion of the MR sensor with tapered configurations toward the ABS. With the method of the present invention the overlap of the MR sensor can be controlled substantially to the line 58. The other embodiment 80 of the present invention is shown in FIG. 6. Again, with the method of the invention the flux guide 82 can be controlled with an overlap on the back end portion of the MR sensor substantially to the line 58. The flux guide 82 in FIG. 6 includes an insulation material layer 84 and a flux guide material layer 86 which have a slightly different overlap configuration than that shown in FIG. 5. The configuration of the overlap of the flux guide 82 in FIG. 6 does not taper to the line 58 but, in contrast has a more square configuration.

It should be noted that the MR head 80 in FIG. 6 is the same as the MR head 60 in FIG. 4. The difference is that with the present method the overlap of the MR head 80 in FIG. 6 can be controlled to the line 58 whereas the overlap of the flux guide 56 in FIG. 4 varies between the lines 66 and 68 and just by chance will overlap at the line 58. The connection between the flux guides and the MR sensors in FIGS. 5 and 6 is known as a contiguous self-aligned junction which is taught in the aforementioned U.S. Pat. No. 5,018, 037 to Krounbi et al. The difference is that the Krounbi et al. patent teaches making electrical connections between conductive elements whereas in the present invention an insulative junction which is magnetically conductive is formed by the contiguous self-aligned junction technique. As will be explained in more detail hereinafter, this same technique is employed for providing longitudinal biasing for the flux guide with the same hard biasing layers which are employed for longitudinally biasing the MR sensor. This longitudinal biasing of the present flux guide is a salient feature of the present invention.

Figure 7A:
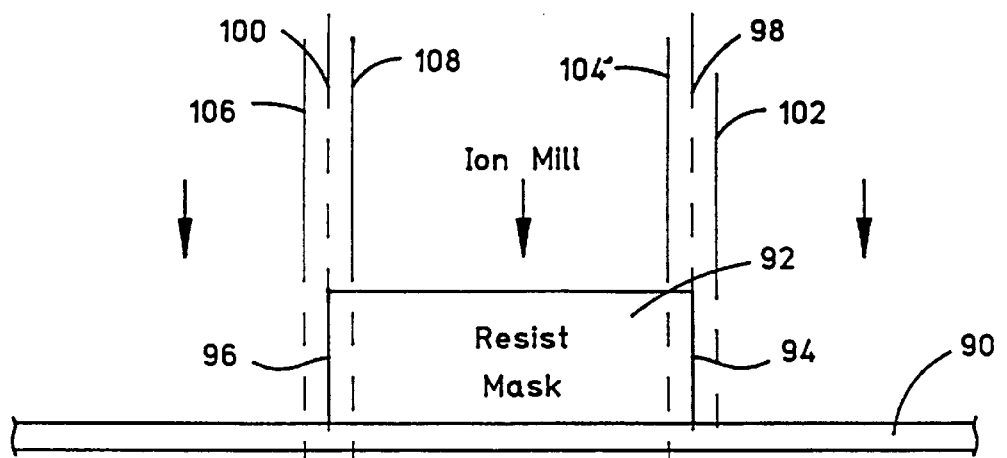
FIGS. 7A–7G show prior art process steps of making a junction between a flux guide and a back end portion of an MR sensor.
Figure 7B:
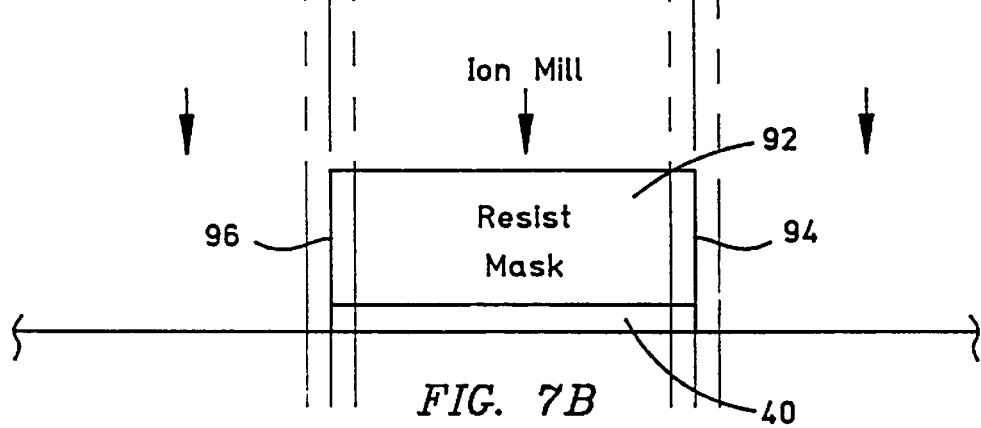
Figure 7C:
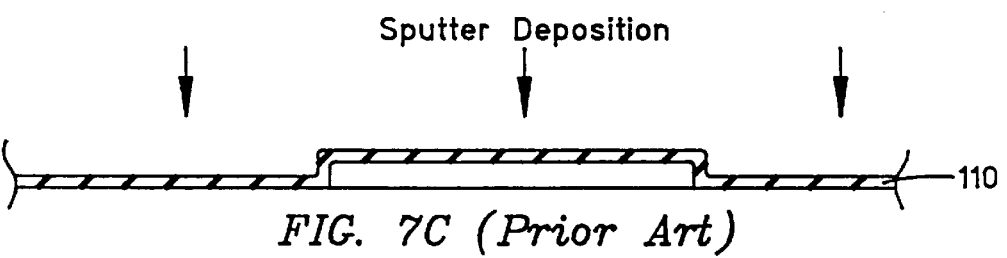
Figure 7D:
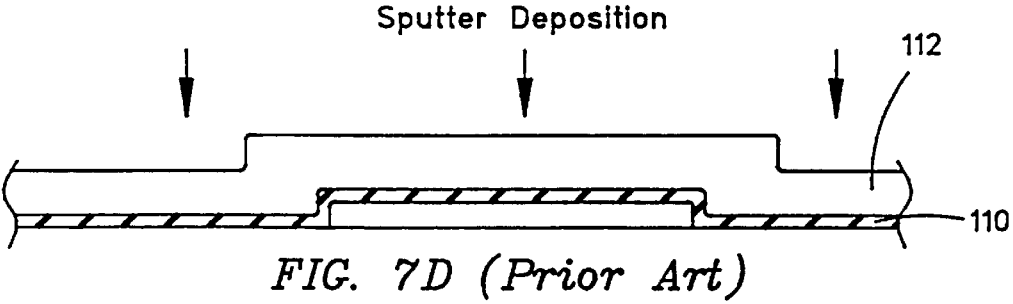
Figure 7E:
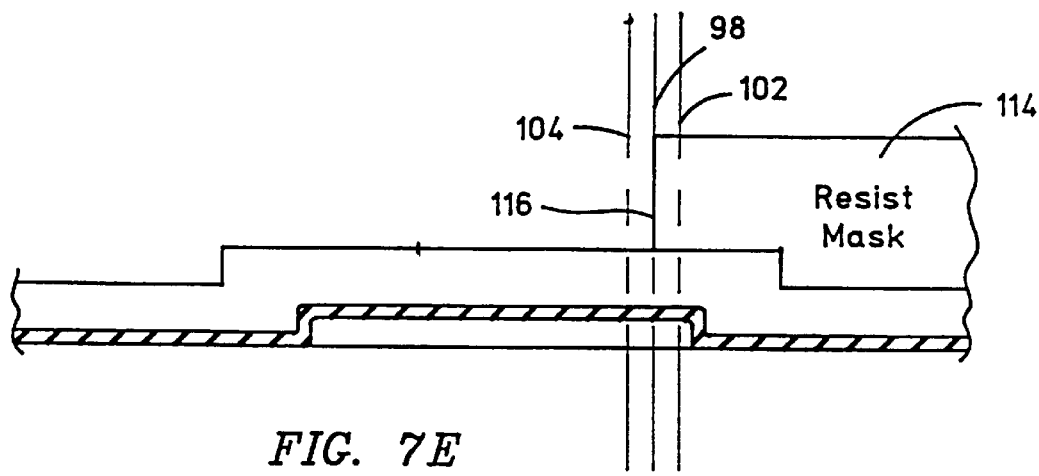
Figure 7F:
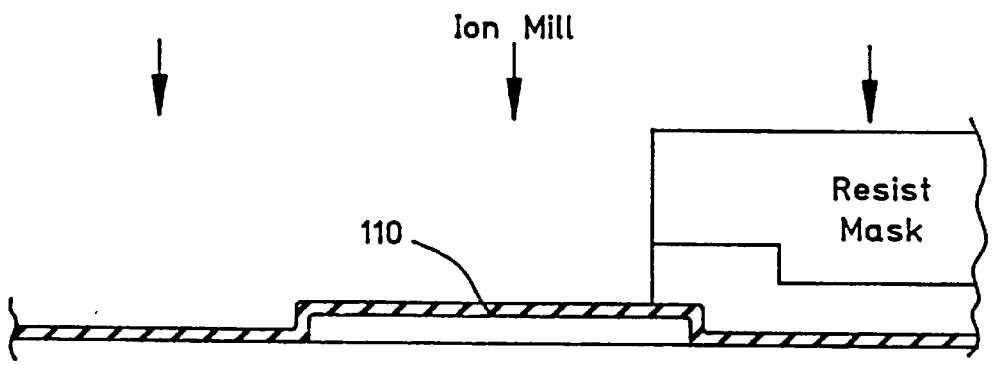
Figure 7G:
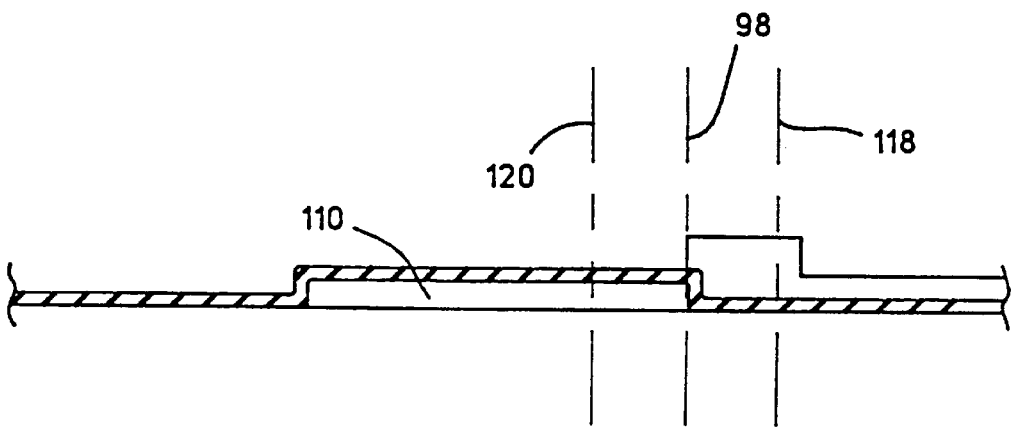

An exemplary method of making the flux guide 60 shown in FIG. 4 is shown in FIGS. 7A–7G. The first step is to form an MR material layer 90. The next step is to form a stencil or resist mask 92 with edges 94 and 96 on the MR material layer 90. Because of the unpredictable shrinkage of the resist mask 92 windage is employed to strike a balance for reducing error in the placement of the edges 94 and 96 at lines 98 and 100 respectively. Even when windage is employed the location of the edges 94 and 96 can vary by ±10% of the width of the resist mask. For a 1 $\mu$m height MR sensor this can amount to ±0.1 $\mu$m which causes the edge 94 to fall anywhere between the line 102 and 104 and the edge 96 to fall anywhere between the line 106 and 108. The next step, as shown in FIG. 7B, is to ion mill the MR sensor material layer 90 beyond the edges 94 and 96 of the resist mask to form the MR sensor 40. While the edges 94 and 96 are shown exactly placed at the desirable lines 98 and 100 these edges will be to the right or left of the lines 98 and 100 a majority of the time. The next step is to remove the resist mask 92 and deposit the insulation material layer 110, as shown in FIG. 7C, and deposit the flux guide material layer 112, as shown in FIG. 7D, by any suitable means such as sputter deposition. Next is to form a resist mask 114, as shown in FIG. 7E, with an edge along line 98 for an overlap of the flux guide on the back end portion of the MR sensor which will be shown hereinafter. The photolithography process presents the same problem in controlling the location of the edge 116 as it did in controlling the edge 94 in FIG. 7A. Even with windage the edge 116 can vary ±10% anywhere between lines 102 and 104 thereby increasing the likelihood of an unacceptable overlap. The next step is to ion mill the exposed layers as shown in FIG. 7F and then remove the resist mask as shown in FIG. 7G. The ion mill step is very difficult to accomplish because of the risk of over milling the insulation material layer which should be less than 300 Å thick. An additional error in the placement of the overlap is the alignment of the edge features 94 and 116 as shown in FIGS. 7A and 7D respectively. Features are aligned from a benchmark on the wafer where multiple magnetic heads are constructed and this error is typically ±0.1 $\mu$m. Accordingly, the final product has a resultant uncontrolled placement of the overlap between lines 118 and 120 which correspond to lines 66 and 68 in FIG. 4. While it is desirable that the overlap be at line 98, it can be off as much as 0.3 $\mu$m at line 118 which renders the flux guide useless, or it can overlap the MR sensor at line 120 causing the flux to be prematurely shunted from the MR sensor, thereby reducing signal strength. On a wafer containing many magnetic heads the yield will be unacceptably low because of the difficulty in obtaining an overlap at or near the desired line 98.

A method for making the embodiment 70 of the present invention shown in FIG. 5 is shown in FIGS. 8A–8E. The first step is to form an MR material layer 90. The next step is to form a resist mask 130 which has undercuts 132 and 134 adjacent the MR material layer 90. The resist mask, which is typically employed for a lift-off process, may comprise two separate layers 136 and 138. The resist layer 136 may be a material which develops isotropically in a developer as contrasted to the resist layer 138 which does not dissolve in the developer. The height of the undercuts 132 and 134 are controlled by the thickness of the layer 136 and the depth of each undercut is controlled by the time in the developer. A typical rate of depth growth in the developer is 0.05 μm/minute. Accordingly, the depth of the undercuts 132 and 134 can be controlled fairly accurately. The shrinkage of the resist mask 130 will have no effect on the accuracy of the overlap which will become clear from the following description. The resist mask 130 is referred to as a negative undercut profile of the resist as compared to a negative resist sloping profile which slopes inwardly from the top of the resist to the bottom of the resist as shown in U.S. Pat. No. 4,841,398. The negative undercut profile of the resist provides a more controlled overlap of the flux guide on the back end of the MR sensor than that obtained with the negative resist sloping profile.

Figure 8A:
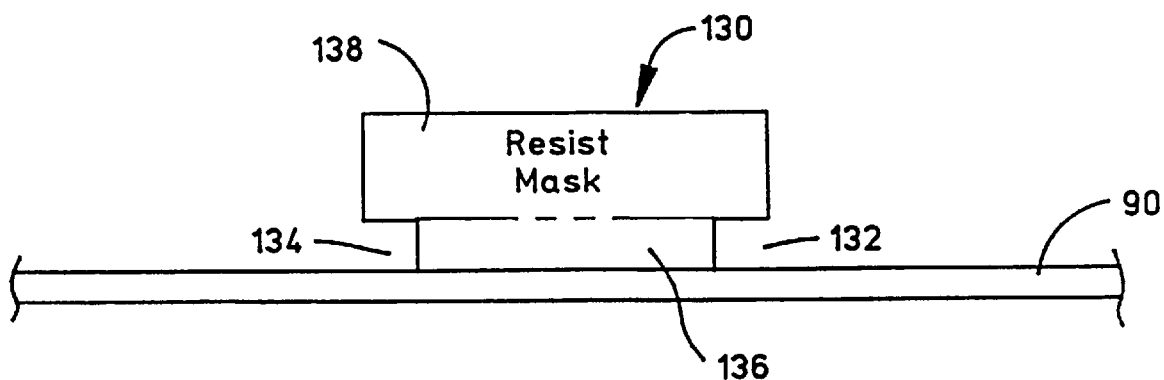
FIGS. 8A–8E show the present process steps of making one embodiment of an insulated contiguous self-aligned junction between a back end portion of an MR sensor and a flux guide.
Figure 8B:
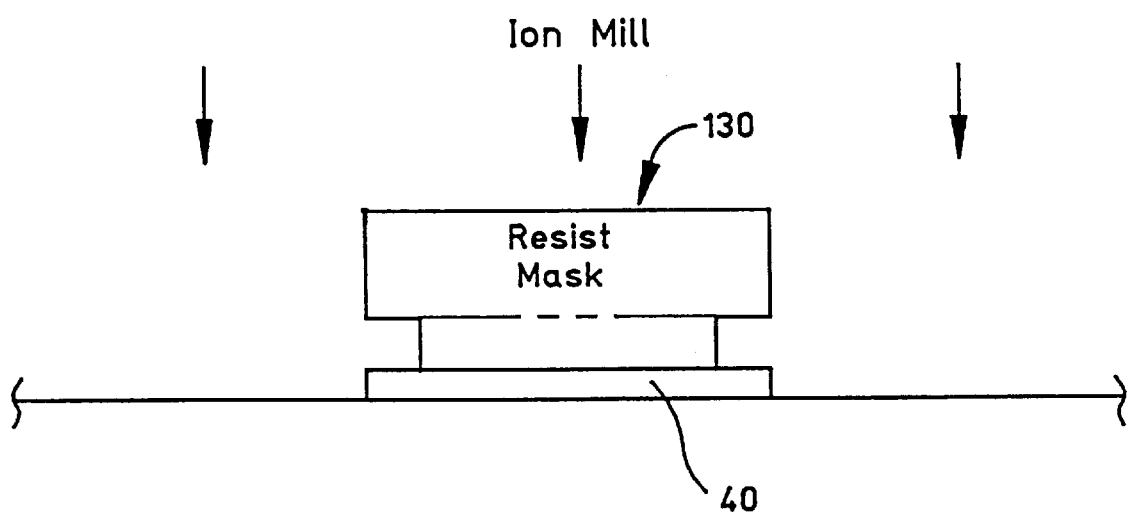
Figure 8C:
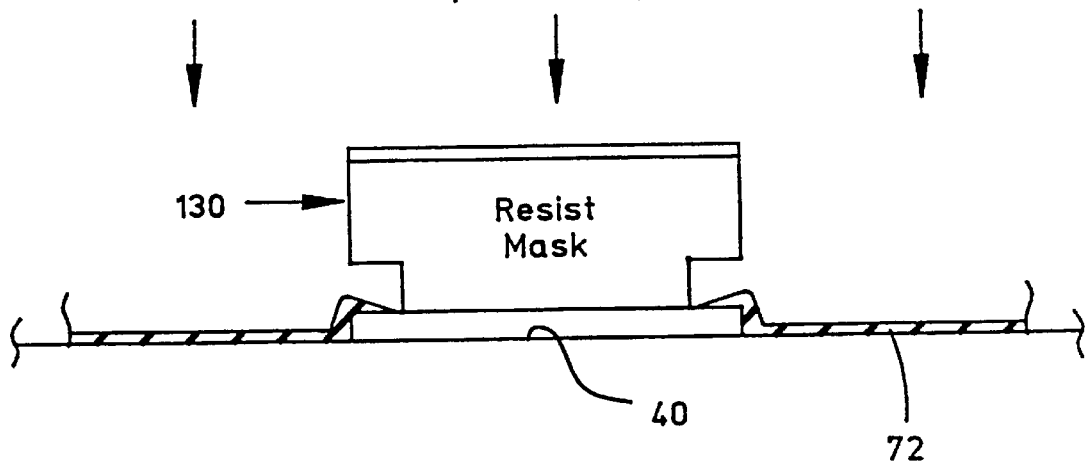
Figure 8D:
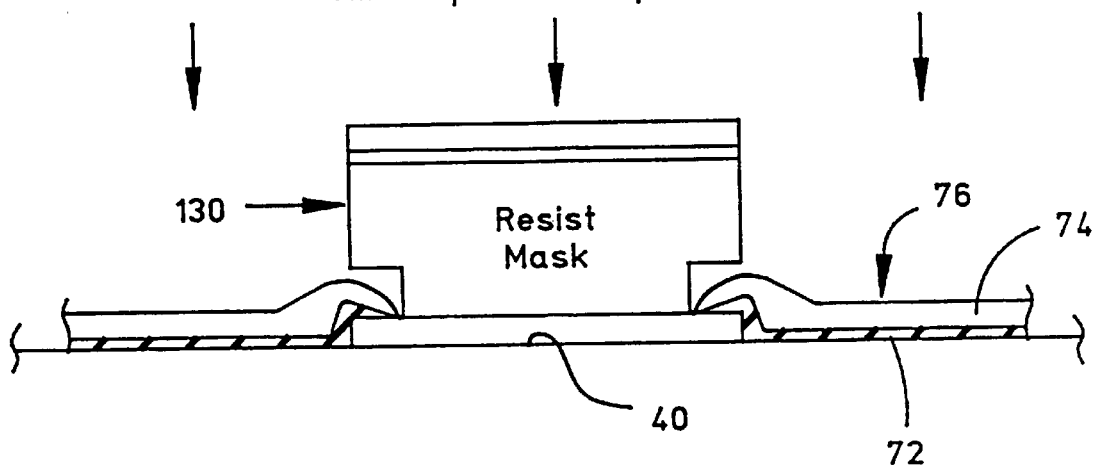
Figure 8E:
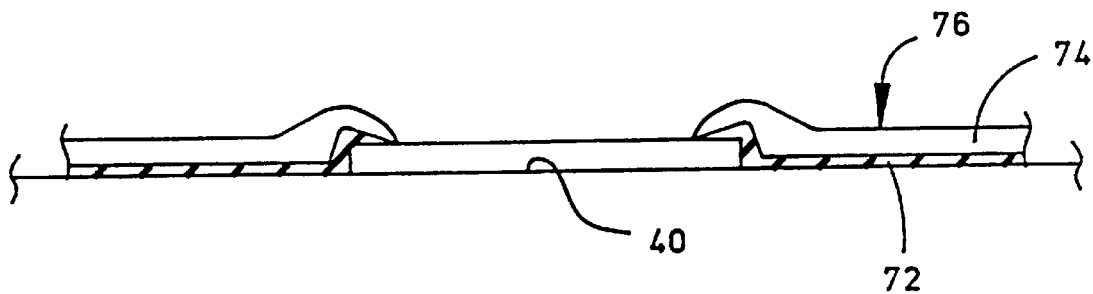

The next step is to ion mill unwanted portions of the MR material layer 90 thereby forming the MR sensor 40 shown in FIG. 8B. The next step is to deposit the insulation material layer 72, as shown in FIG. 8C, and then deposit the flux guide material layer 74, as shown in FIG. 8D, by any suitable means such as R. F. sputter depositions. The resist mask 130 is then lifted off by dissolving it in a solution leaving the flux guide overlapping the back end portion of the MR sensor as shown in FIG. 8E. The insulation material layer and the flux guide material layer on the bottom side of the MR sensor (left side of FIG. 8E) may be removed by lapping to form the ABS. In this embodiment the insulation material layer and the flux guide material layer form the flux guide 76 with overlapping tapered end portions which extend toward the ABS. Accordingly, the contiguous self-aligned junction between the MR sensor and the flux guide 76, shown in FIGS. 5 and 8E, is characterized by a method of construction which employs a single resist mask for defining the back end of the MR sensor and deposition of a controlled overlap of the flux guide on the back end portion of the MR sensor. It should be noted that R.F. sputtering is done in an atmosphere of $40 \times 10^{-3}$ torr. Within a chamber at this pressure argon ions bombard a target which release insulation material ions. After complete deposition of the insulation layer, the target is switched to a metallic or a metallic magnetic material upon which deposition resumes until the flux guide layer is deposited. The target ions traverse an argon atmosphere which causes a lot of collisions and isotropic deposition. Accordingly, the deposition is directed not only downwardly but at an angle into the undercuts 132 and 134 causing the overlapping depositions as shown. The thickness of the deposited layer becomes less as the undercut becomes deeper causing the tapered configurations of the insulation material layer 72 and the flux guide material layer 74 as it projects within the undercut. It should be understood that the side edges of the MR sensor can be tapered prior to deposition of the layers 72 and 74 as shown in FIGS. 4 and 5 of the aforementioned U.S. Pat. No. 5,018,037 to Krounbi.

Figure 9A:
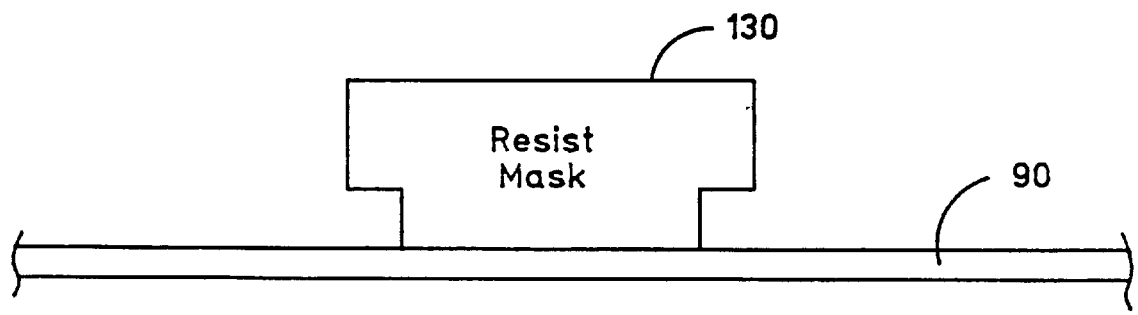
FIGS. 9A–9F show the present process steps of making another embodiment of an insulated contiguous self-aligned junction between a flux guide and a back end portion of an MR sensor.
Figure 9B:
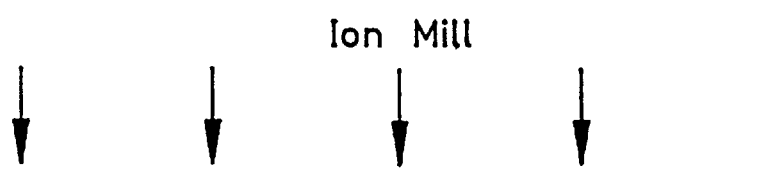
Figure 9C:
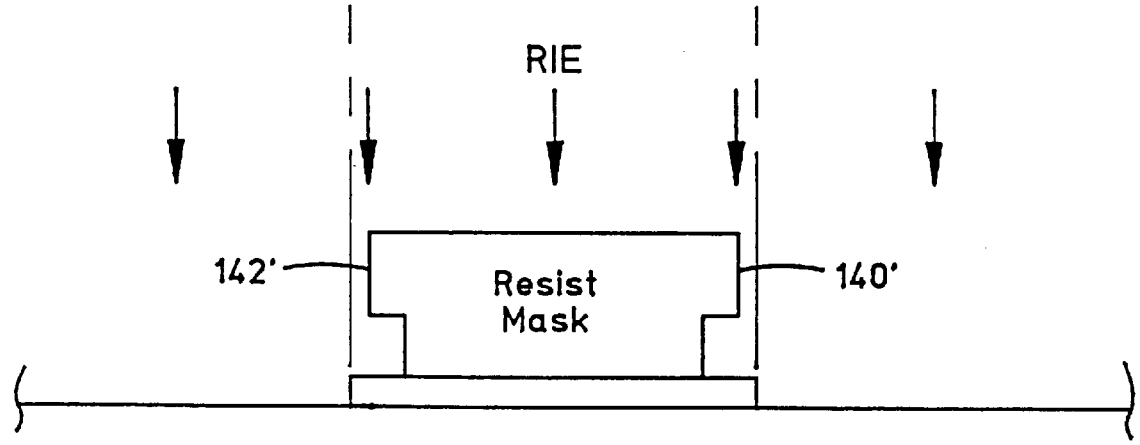
Figure 9D:
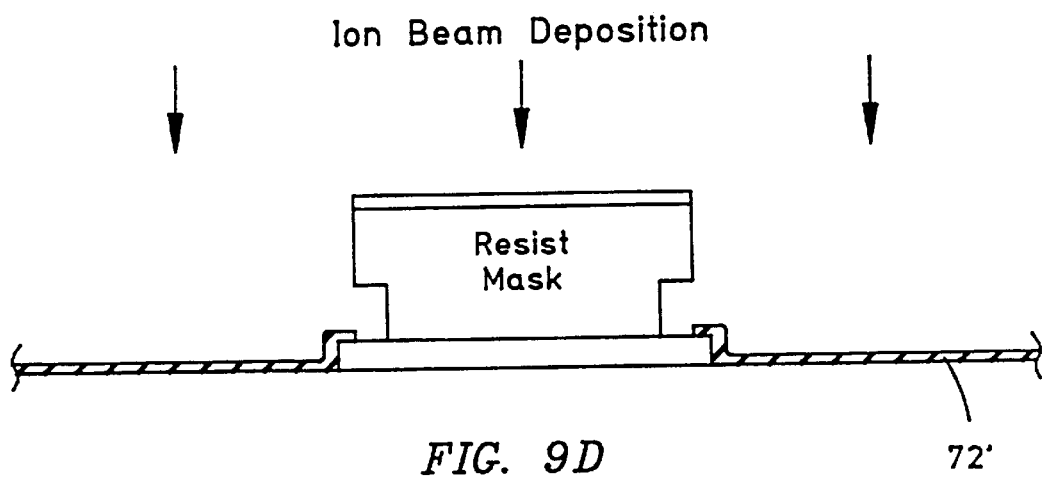
Figure 9E:
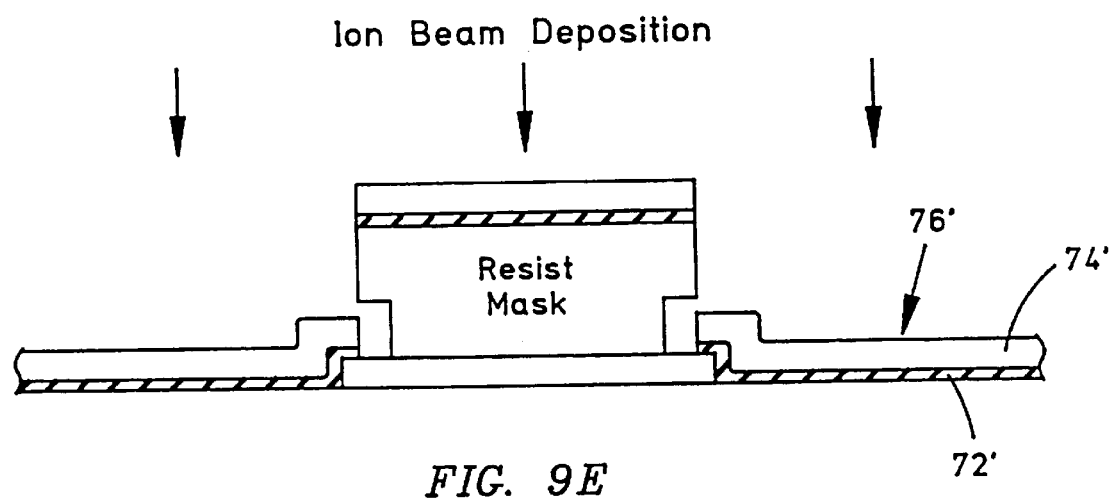
Figure 9F:
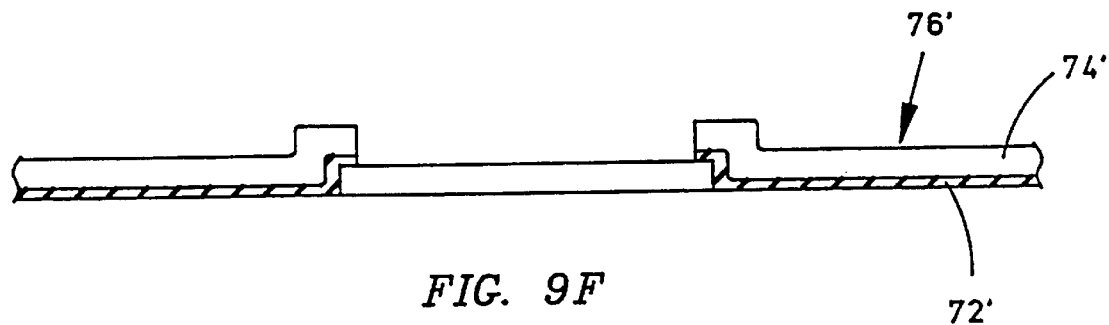

Another method of constructing the contiguous self-aligned junction of the present invention is shown in FIGS. 9A–9F which forms the junction shown in FIG. 6. As shown in FIG. 9A the resist mask 130 is formed over an MR material layer 90, the same as described for FIG. 8A. As described for FIG. 8B, the unwanted MR material is ion milled away as shown in FIG. 9B. The process now differs in the steps shown in FIG. 9C where the wafer is etched by a reactive plasma, such as oxygen, which causes the edges 140 and 142 to be formed inwardly as shown at 140' and 142' in FIG. 9C. The amount of inward etching of these edges will control the amount of overlap of the flux guide on the MR sensor. The next step is to form the insulation material layer 72' and flux guide material layer 74' by a directional process, such as ion beam deposition, as shown in FIGS. 9D and 9E. The resist mask is then removed as shown in FIG. 9F. The result is a very accurate contiguous self-aligned junction which forms the junction as shown in FIG. 6. The insulation layer and the flux guide material layer do not taper as they overlap the end portions of the MR sensor since their depositions are very directional. In his embodiment the undercuts in the resist mask are employed only for lift-off of the resist mask and layers thereon. A solution is employed for dissolving the undercut layer resulting in lift off of the resist mask.

FIG. 10 schematically shows an MR sensor with flux being induced from a rotating magnetic disk. The height of the MR sensor is shown in the y direction. Assuming that the MR sensor is longitudinally biased parallel to the ABS the magnetic moment within the sensor is parallel to the ABS before flux is induced therein. Upon the inducement of flux the magnetic moment is rotated upwardly to the greatest extent closest to the ABS and gradually decreases down to zero at the back end of the MR sensor which is opposite the ABS. The $M_y$ component is plotted in FIG. 11 versus height y of the MR sensor for a prior art MR sensor without a flux guide as shown at 54, and at 150, 152 and 154 for embodiments of the present invention employing insulation layers 200 Å thick, 100 Å thick and 50 Å thick respectively. Even though the curves 150, 152 and 154 represent MR sensors which have flux guides the flux within the sensor still drops to nearly zero at the back end of the sensor as shown at y=1, since this represents the effective flux within the sensor which corresponds to signal strength. It should be noted however that the curves 150, 152 and 154 of the present invention are higher than the curve 54 for the prior art sensor without a flux guide. It is the area under these curves which represents the effective signal strength of the respective MR sensor.

It should also be noted that in the present invention the signal strength is highest for an insulation layer which is 50 Å thick as compared to insulation layers which are 100 Å and 200 Å thick. The preferred thickness for the insulation layer is 50 Å thick, however, the present invention provides an improvement over the prior art MR sensor without a flux guide when the insulation layer is 300 Å thick or less. An important aspect of the present invention is that the insulation layer can be controlled to a thickness of 50 Å since there is no problem of over-milling during the construction process.

As stated hereinabove, it is desirable to provide an overlap of the flux guide on the back end portion of the MR sensor of about 10% which would be at the y=0.9 mark shown in FIG. 11. The present invention can control this placement to within 0.05 of a μm which is related to the control of making the undercuts in the resist mask shown in FIGS. 8A–8E. Accordingly, by the process shown in FIGS. 8A–8E the variation in the placement of the overlap can be controlled between 0.875 μm and 0.925 μm in the y direction as shown by lines 160 and 162 respectively. As stated hereinabove, the prior art variation of the overlap is between 1.2 μm and 0.6 μm in the y direction as shown by lines 118 and 120. Accordingly, the shapes of the curves 150, 152 and 154 can be more accurately controlled with the present invention by placing the humps in these lines very close to the 0.9 mark. If these humps are moved to the left the effective areas under the curves are reduced which equates to reduced signal strengths. The reason for this is because the increased overlapping of the flux guide on the back end portion of the MR sensor shunts the flux guide to a greater degree than when the overlap is less. As stated hereinabove, if there is no overlap then the flux guide is useless. Accordingly, it is important to employ the process shown in FIGS. 8A–8D so that the overlap of the flux guide on the back end of the MR sensor can be more accurately controlled. Since the undercut of the resist mask shown in FIGS. 9A–9F is only employed for lift-off, the overlap can be even more accurately controlled over the process described for FIGS. 8A–8D. In some embodiments the overlap may be between zero to one-half the height of the MR Sensor.

FIGS. 12A–12H and 13A–13H provide additional detail on methods of making the present invention employing either of the methods shown in FIGS. 8A–8D or FIGS. 9A–9F. In FIG. 12A a layer of MR sensor material 170 is deposited by any suitable means such as sputtering. In FIG. 12B a resist mask 172 is formed with openings 174 and 176. The MR material within the openings 174 and 176 is then ion milled away to provide rectangular wells in the MR sensor material. Lead and hard bias layers are then deposited by any suitable means such as sputtering within the openings 174 and 176 to provide lead and hard bias islands 178 and 180 as shown in FIG. 12C. The resist mask 172 may conform either to the resist mask of FIG. 8B or to the resist mask of FIG. 9C. This will then provide a contiguous self-aligned junction between the lead and hard bias islands 178 and 180 and the MR sensor material 170. It should be noted that the lateral distance between the lead and hard bias islands 178 and 180 will establish the track width of the head. Next, a resist mask 182 is formed with an opening 184 which exposes a portion of the MR sensor material and the lead and hard bias islands. The layer portions within this opening 184 are ion milled away and insulation and flux material layers are then deposited therein as shown in FIG. 12E. FIG. 12F shows the layers after the removal of the resist mask 182. In the same manner as the previous mask 172 the resist mask 182 may be formed according to either FIG. 8B or FIG. 9C so as to provide an insulated contiguous self-aligned junction between the insulation and flux material layers on one hand and the lead and hard bias layers 178 and 180 on the other hand. Next, a resist mask 188 is formed on the layers to define the final configuration of the layers. All layers outside the mask 188 are milled away to provide the final configuration as shown in FIG. 12H. The flux guide is shown at 190 which makes a contiguous self-aligned junction with the MR sensor at 192. The lead and hard bias layers 194 and 196 make contiguous self-aligned junctions with the edges of the MR sensor at 198 and 200 and make contiguous self-aligned junctions with the flux guide 190 at 202 and 204. It should be noted that by the process just described that the same hard bias layer which longitudinally biases the MR sensor also longitudinally biases the flux guide 190. It should be understood that the lead and hard bias layers are a multilayer of lead material and hard bias material, the lead material providing leads for transmitting the sense current through the MR sensor and the hard bias material for longitudinally biasing the MR sensor to prevent Barkhausen noise.

Figure 13A:
FIGS. 13A–13H are similar to FIGS. 12A–12H except the steps are in a different order.
Figure 13B:
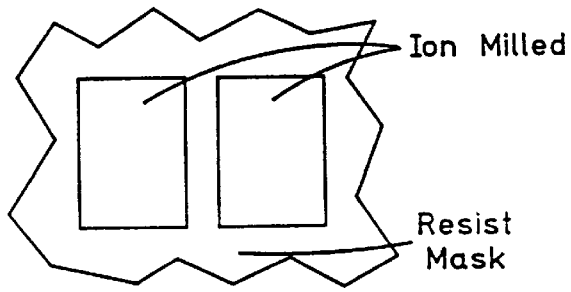
Figure 13C:
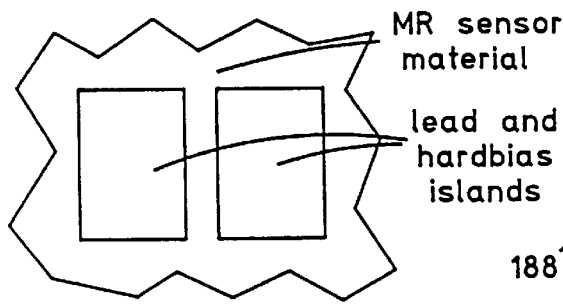
Figure 13D:
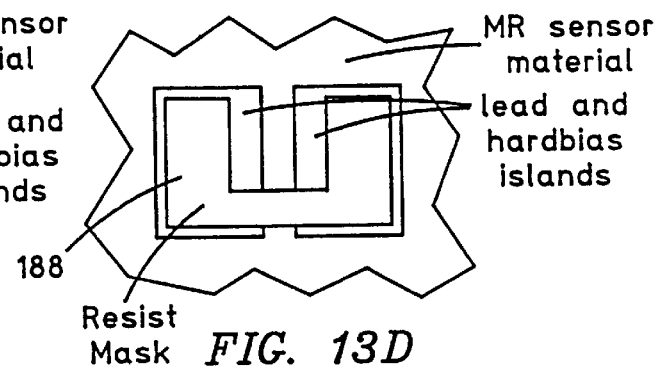
Figure 13E:
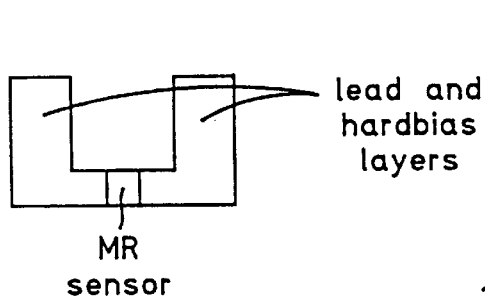
Figure 13F:
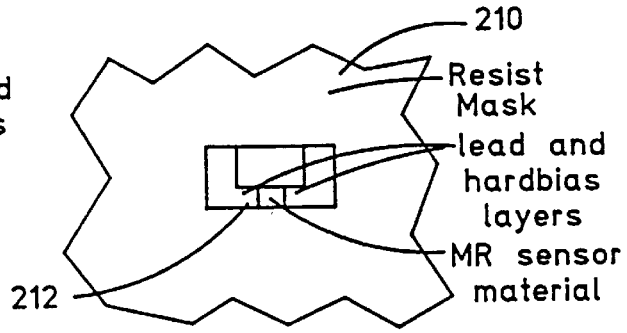
Figure 13G:
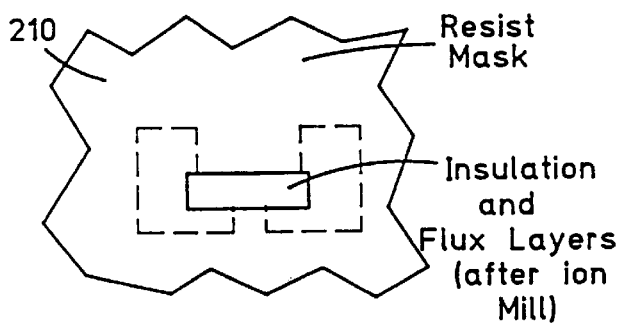
Figure 13H:
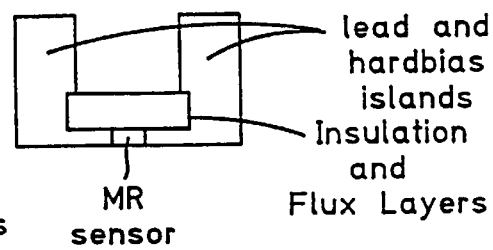

The process shown in FIGS. 13A–13H is similar to that shown in FIGS. 12A–12H except the order has been changed. The order in FIGS. 13A, 13B and 13C are the same as the order in FIGS. 12A, 12B and 12C respectively. In FIG. 13D the mask 188 employed in FIG. 12G is employed for defining the final shape of the layers. Layers exterior the resist mask 188 are milled away to provide the configuration shown in FIG. 13E. A resist mask 210 is then employed with an opening 212 exposing the MR sensor material and the lead and hard bias layers on each side thereof. These layers are removed and then insulation and flux material layers are deposited as shown in FIG. 13G. The resist mask 210 as well as the resist mask 188 may be constructed according to FIG. 8B or FIG. 9C so that contiguous self-aligned junctions are formed between the layers. Upon removal of the resist mask 210 the final configuration of the layers is shown in FIG. 13H which is equivalent to the final configuration of the layers shown in FIG. 12H.

Figure 14A:
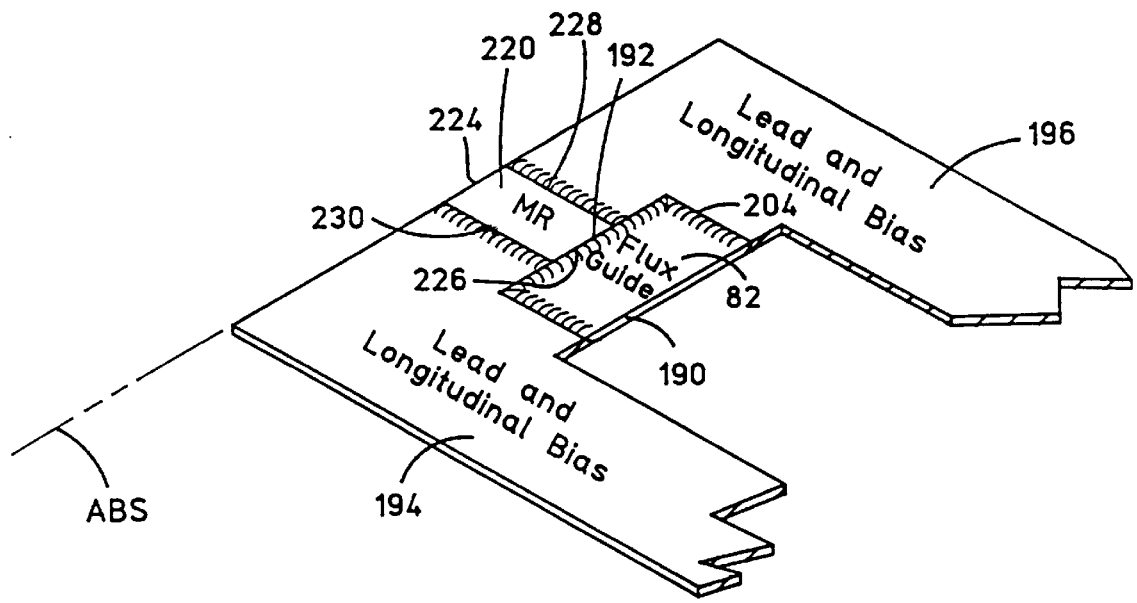
FIG. 14A is an isometric view of a flux guide and/or heat guide making an insulated contiguous self-aligned junction with the back end portion of an MR sensor and a pair of hard bias layers making insulated contiguous self-aligned junctions with side edges of each of the MR sensor of the flux guide and/or heat guide.
Figure 14B:
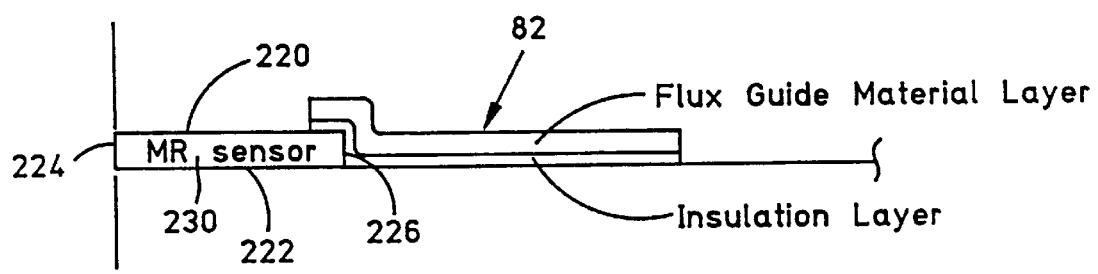
FIG. 14B is a cross section of FIG. 14A along the height of the MR sensor and the flux guide and/or heat guide.

FIG. 14A is an isometric illustration of the flux guide constructed according to the preceding processes employing the resist mask as shown in FIG. 9C. As shown in FIGS. 14A and 14B, the MR sensor has first and second surfaces 220 and 222 which are bounded by first and second end edges 224 and 226 and first and second side edges 228 and 230, the first end edge 224 being at the ABS. It can be seen from FIGS. 14A and 14B that the flux guide overlaps the back end portion of the first surface 220 of the MR sensor. From FIG. 14A it can be seen that the lateral sides of the flux guide overlap the lead and hard bias layers. All of these connections may be insulated contiguous self-aligned junctions. It can be seen from FIG. 14A that the lead and hard bias layers longitudinally bias both the MR sensor and the flux guide to prevent Barkhausen noise. This is a salient feature of the present invention.

Figure 15:
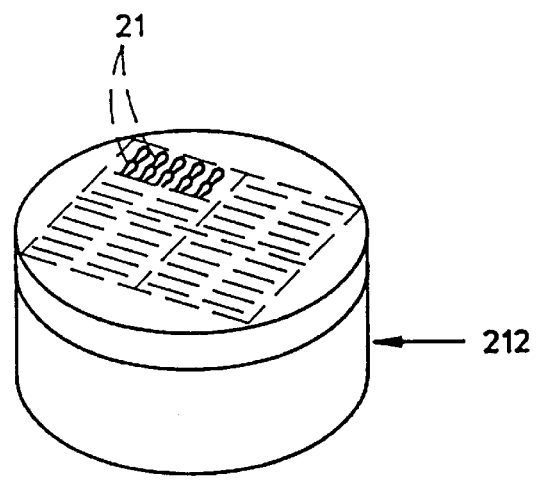
FIG. 15 is an isometric view of a wafer where a plurality of units are constructed with insulated contiguous self-aligned junctions according to the present invention.

FIG. 15 shows a wafer 212 where a plurality of units, such as MR read heads 214, may be constructed according to the teachings of the present invention. By practicing the teachings of the present invention the yield of MR heads constructed on the wafer will be significantly higher than the yield if prior art teachings are employed.

The aforementioned insulation layer may be made of alumina and the aforementioned flux guide layer may be made of Permalloy ($Ni_{80}Fe_{20}$). It should be understood that a heat guide may be substituted in place of the flux guide in which case there would be an insulation layer of alumina and a highly heat conductive material such as copper. Further, the guide may be a combined flux guide and heat guide in which case the first layer would be an insulation layer of alumina, the second layer could be Permalloy ($Ni_{80}Fe_{20}$) and the third layer could be copper. Accordingly, for the term flux guide herein the term heat guide or the term combined flux guide and heat guide may be substituted therefor. The magnetic moment of the flux guide material may be one to four times the magnetic moment of the sensing film of the MR Sensor.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

We claim:

1. A magnetoresistive (MR) read head, comprising:
an MR sensor having first and second surfaces bounded by first and second end edges and first and second side edges, the first end edge being at an air bearing surface;
a flux/heat guide material bilayer which overlays an insulation material layer;
the flux/heat guide material bilayer including a flux guide material layer and a heat guide material layer;
the flux/heat guide material bilayer forming a contiguous junction with the second end edge of the MR sensor and having a length portion which extends from the contiguous junction away from the air bearing surface;
the contiguous junction comprising the flux/heat guide material bilayer abutting the second end edge of the MR sensor and overlapping an end portion of the first surface of the MR sensor adjacent the second end edge with the insulation material layer being sandwiched between the MR sensor and the flux/heat guide material bilayer;

the MR sensor and the flux/heat guide material bilayer being sandwiched between first and second gap layers;

the first and second gap layers being sandwiched between first and second shield layers;

each of the insulation material layer and the flux/heat guide material bilayer having an overlapping portion which forms the overlap of said flux/heat guide material bilayer on the end portion of the MR sensor; and each of said overlapping portions being tapered toward the air bearing surface.

2. An MR read head as claimed in claim 1 wherein the overlap of the flux/heat guide material bilayer on the end portion of the MR sensor is between zero and one-half a height of the MR sensor between said first and second end edges.

3. A magnetoresistive (MR) read head, comprising:

an MR sensor having first and second surfaces bounded by first and second end edges and first and second side edges the first end edge being at an air bearing surface;

a flux/heat guide material bilayer which overlays an insulation material layer;

the flux/heat guide material bilayer including a flux guide material layer and a heat guide material layer;

the flux/heat guide material bilayer forming a contiguous junction with the second end edge of the MR sensor and having a length portion which extends from the contiguous junction away from the air bearing surface;

the contiguous junction comprising the flux/heat guide material bilayer abutting the second end edge of the MR sensor and overlapping an end portion of the first surface of the MR sensor adjacent the second end edge with the insulation material layer being sandwiched between the MR sensor and the flux/heat guide material bilayer;

the MR sensor and the flux/heat guide material bilayer being sandwiched between first and second gap layers;

the first and second gap layers being sandwiched between first and second shield layers;

the flux/heat guide material bilayer having first and second side edges;

first and second longitudinal biasing layers; and the first longitudinal biasing layer being connected to the first side edge of each of the MR sensor and the flux/heat guide material bilayer and the second longitudinal biasing layer being connected to the second side edge of each of the MR sensor and the flux/heat guide material bilayer.

4. An MR read head as claimed in claim 3, including:

the connections of the first and second longitudinal biasing layers to the first and second side edges of the MR sensor being electrically conducting contiguous junctions and the connections of the first and second longitudinal biasing layers to the first and second side edges of the flux/heat guide material bilayer being electrically insulating contiguous junctions.

5. An MR read head as claimed in claim 4, including:

each of the insulation material layer and the flux/heat guide material bilayer having an overlapping portion which forms the overlap of said flux/heat guide material bilayer on the end portion of the MR sensor; and each of said overlapping portions being tapered toward the air bearing surface.

6. An MR read head as claimed in claim 5, including:

the MR sensor, the flux/heat guide material bilayer and the first and second longitudinal biasing layers forming a U shape which has a bottom straight edge located at the air bearing surface.

7. An MR read head as claimed in claim 6, wherein the heat guide material layer is copper (Cu).

8. An MR read head as claimed in claim 6, wherein the flux guide material layer is nickel iron (NiFe) and the heat guide material layer is copper (Cu).

* * * * *